United States Patent
Ogami et al.

(10) Patent No.: US 6,637,015 B1
(45) Date of Patent: Oct. 21, 2003

(54) SYSTEM AND METHOD FOR DECOUPLING AND ITERATING RESOURCES ASSOCIATED WITH A MODULE

(75) Inventors: Kenneth Y. Ogami, Bothell, WA (US); Manfred Bartz, Snohomish, WA (US); Douglas H. Anderson, Edmund, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/989,781

(22) Filed: Nov. 19, 2001

(51) Int. Cl.[7] .............................................. G06F 17/50
(52) U.S. Cl. ................................ 716/9; 716/1; 716/17; 716/8; 716/10
(58) Field of Search ............................. 716/9, 1–8, 19, 716/17, 16, 10–15

(56) References Cited

U.S. PATENT DOCUMENTS

| | | | | |
|---|---|---|---|---|
| 5,422,833 A | * | 6/1995 | Kelem et al. ................... 703/14 |
| 5,898,595 A | * | 4/1999 | Bair et al. ....................... 716/2 |
| 6,128,768 A | * | 10/2000 | Ho ................................. 716/5 |
| 6,425,116 B1 | * | 7/2002 | Duboc et al. .................. 716/18 |
| 6,438,729 B1 | * | 8/2002 | Ho ................................. 716/1 |
| 6,449,761 B1 | * | 9/2002 | Greidinger et al. ............ 716/11 |
| 6,460,172 B1 | * | 10/2002 | Insenser Farre et al. ...... 716/17 |
| 6,477,687 B1 | * | 11/2002 | Thomas .......................... 716/8 |
| 2001/0049813 A1 | * | 12/2001 | Chan et al. ..................... 716/8 |
| 2002/0100003 A1 | * | 7/2002 | McBride ......................... 716/4 |
| 2002/0108006 A1 | * | 8/2002 | Snyder ......................... 710/100 |
| 2002/0166103 A1 | * | 11/2002 | Rittman et al. ................ 716/11 |

* cited by examiner

Primary Examiner—Vuthe Siek
Assistant Examiner—Magid Dimyan
(74) Attorney, Agent, or Firm—Wagner, Murabito & Hao LLP

(57) ABSTRACT

A system and method for graphically displaying modules and resources within a chip design software application. The system and method provide a graphical interface which relate both a module and the associated resource. This graphical interface utilizes highlights of both the module and the associated resource in patterns, grayscales, or colors to graphically illustrate the relationship between the module and the associated resource. The system and method also provide a graphical interface which illustrates a fixed group and unfixed group of resources associated with a particular module. The unfixed group of resources can be iterated to a next possible location on the chip that would satisfy the requirements of the associated module. Any fixed group of resources can be selected as the unfixed group by selecting that group of resources.

41 Claims, 11 Drawing Sheets

SYSTEM AND METHOD FOR DECOUPLING AND ITERATING RESOURCES ASSOCIATED WITH A MODULE

RELATED APPLICATIONS

U.S. patent application Ser. No. 10/033,027, entitled "PROGRAMMABLE MICROCONTROLLER ARCHITECTURE," having docket number CYPR-CD00232, filed on Oct. 22, 2001, and with inventor Warren Snyder is hereby incorporated by reference.

FIELD OF THE INVENTION

The invention relates generally to the field of chip design software applications, more particularly to a system and method for placing resources within an integrated circuit device.

BACKGROUND OF THE INVENTION

It is often useful to utilize chip design application software to layout and plan new integrated circuits. This chip design application software is typically configured to aide the user in keeping track of resource requirements of particular modules. Furthermore, chip design application software also allows users to assign chip resources to particular modules.

However, chip design software applications typically have minimal graphical support. They usually are not capable of supplying the user with a graphical display representing a current status of the layout of the resources on a chip. Circuit designers are typically required to manually and textually track their layout decisions with minimal graphical support. Further, typical software packages do not give graphical representations of possible placement of resources for unplaced user modules. Additionally, typical software packages also do not provide alternative possible placements for user modules within the available programmable resources.

It is useful to provide a circuit designer with a circuit design application software that provides the chip designer with a comprehensive graphical display of the chip planning process. For example, being able to graphically display a module implemented on a chip along with the associated resources would be useful. Further, being able to graphically display a module and various resources which would satisfy the requirements of the module would also be beneficial. Additionally, being able to give alternative possible placements for user modules within the available programmable resources would also be beneficial.

SUMMARY OF THE INVENTION

A system and method for graphically displaying modules and resources within a chip design software application are described. The system and method provide a graphical interface which relate both a module and the associated resource. This graphical interface utilizes highlights of both the module and the associated resource in patterns, grayscales, or colors to graphically illustrate the relationship between the module and the associated resource. The system and method also provide a graphical interface which illustrates a fixed group and unfixed group of resources associated with a particular module. The unfixed group of resources can be iterated to a next possible location on the chip that would satisfy the requirements of the associated module. Any fixed group of resources can be selected as the unfixed group by selecting that group of resources.

More specifically, in a computer system, an embodiment of the present invention is drawn to a method of designing an integrated circuit comprising: a) displaying a plurality of images each representing a programmable resource, the plurality of images comprising a first set and a second set; b) determining and displaying a first placement of a user module, the first placement comprising a first resource of the first set visually distinguished and a second resource of the second set visually distinguished; and c) responsive to a user request, determining and displaying a second placement of the user module, the second placement comprising the first resource of the first set visually distinguished and a third resource of the second set visually distinguished, wherein the second and third resources are different.

Embodiments include the above and wherein the first set comprises digital or analog programmable blocks and the second set comprises analog or digital programmable blocks. Embodiments include the above further comprising, responsive to a user request, displaying a third placement of the user module, the third placement comprising a fourth resource of the first set visually distinguished and the third resource of the second set visually distinguished, wherein the first and fourth resources are different. Embodiments include the above and wherein the integrated circuit is a microcontroller.

Other aspects and advantages of the invention will become apparent from the following detailed description, taken in conjunction with the accompanying drawings, and illustrated by way of example of the principles of the invention.

DETAILED DESCRIPTION

Specific reference is made in detail to the embodiments of the invention, examples of which are illustrated in the accompanying drawings. While the invention is described in conjunction with the embodiments, it will be understood that the embodiments are not intended to limit the scope of the invention. The various embodiments are intended to illustrate the invention in different applications. Further, specific details are set forth in the embodiments for exemplary purposes and are not intended to limit the scope of the invention. In other instances, well-known methods, procedures, and components have not been described in detail as not to unnecessarily obscure aspects of the invention.

Figure 1:
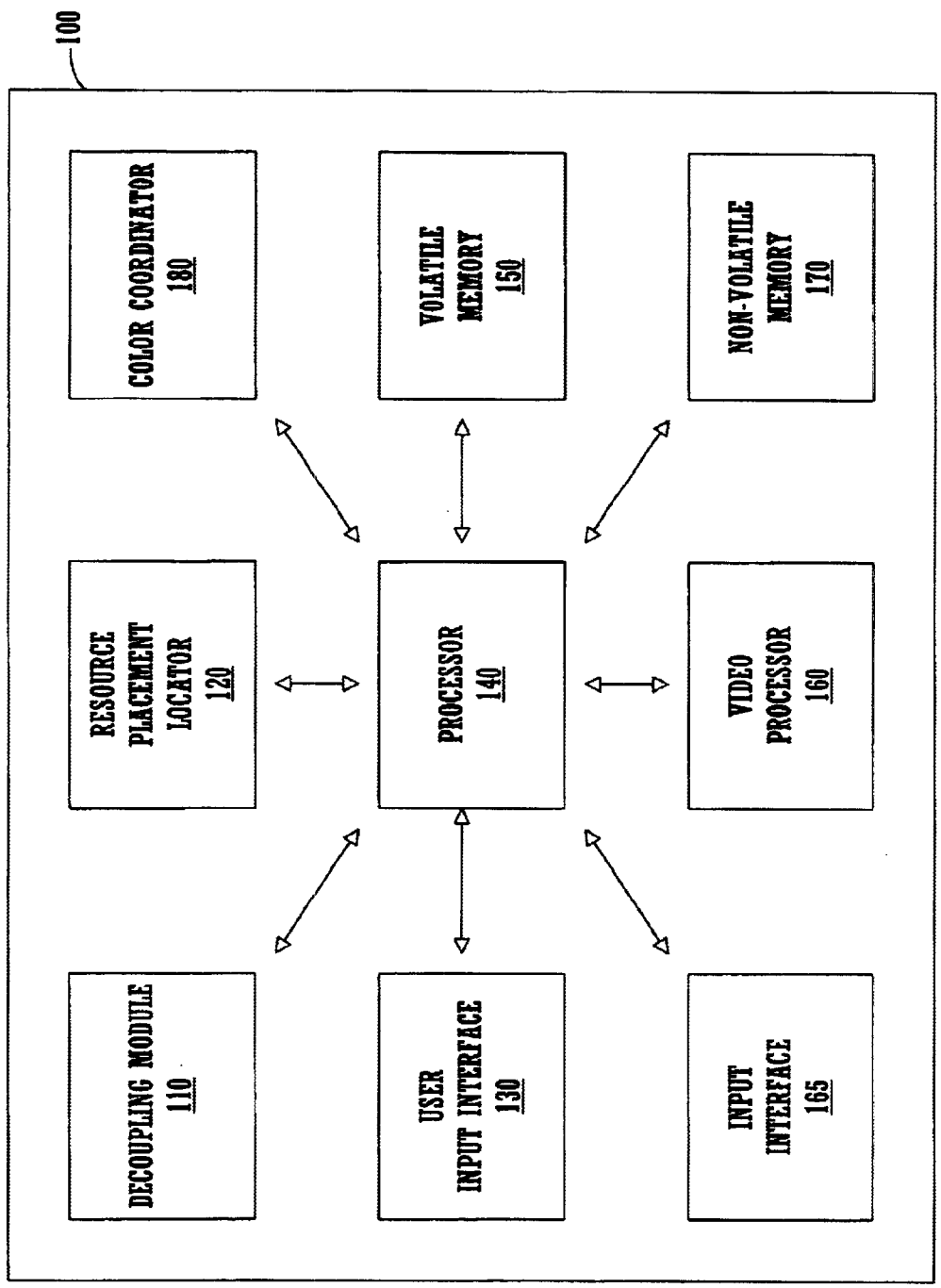
FIG. 1 illustrates a system for coding modules and associated resource(s) in accordance with the invention.

With reference to FIG. 1, a system 100 for graphically illustrating alternative possible placements for user module resources and for decoupling multiple user module resources in the placement process according to the invention is shown. The system 100 operates within a chip design application to graphically display the correlation between an unplaced module and possible resources that would fulfill the requirements of the unplaced module. Further, the system 100 also operates to graphically display the correlation between an unplaced module and multiple alternate possible resources associated with the unplaced module. In one embodiment, the graphical correlation between the unplaced module and the possible resources associated with the unplaced module are displayed by use of a corresponding color within the design application.

The system 100 includes a processor 140, a user input interface 130 (e.g., cursor control device and keyboard), volatile memory 150, a video processor 160, and non-volatile memory 170. The user input interface 130, the volatile memory 150, the video processor 160, and the non-volatile memory 170 are connected to the processor 140. The input interface 130, the processor 140, the volatile memory 150, the video processor 160, and the non-volatile memory 170 are components that are readily found in personal computer systems.

The system 100 further includes a decoupling module 110, a resource placement locator 120, and a color coordinator 180, which are also connected to the processor 140. The components 110, 120, and 180 are merely illustrated in FIG. 1 as one embodiment of the system 100. Although the components 110, 120, and 180 are illustrated in FIG. 1 as separate components of the system 100, two or more of these components may be integrated, thus decreasing the number of components in the system 100. Similarly, the components 110, 120, and 180 may also be separated, thus increasing the number of components within the system 100. The components 110, 120, and 180 may be implemented in any combination of hardware, firmware and software.

In one embodiment, the system 100 helps users more accurately and efficiently design chip layouts. The system 100 automatically finds potential placements of resources which fulfill the requirements of the associated user module. The system 100 iterates through multiple potential placement possibilities for resources, thus giving the user of the system 100 multiple choices for resource placement. Through these iterations, the system 100 allows the resources to be decoupled for placement. For example, if multiple resources are needed for a user module, one of the resources may be selected to be iterated through for placement possibilities. Meanwhile the other remaining resources are held constant at one of many possible placements and are not iterated through the remaining possible placements.

Further, the system 100 also graphically displays relationships between the user module and the decoupled corresponding resources. In one embodiment, the system 100 graphically displays the fixed resources which cannot be iterated relative to the associated user module and the next placement resources which can be iterated through multiple locations relative to the associated user module.

In one embodiment, the system 100 is configured to support microcontroller design. In another embodiment, the system 100 is configured to support programmable microcontroller design. In yet another embodiment, the system 100 supports general chip design.

The input interface 165 provides a means for the system 100 to receive user input which may include selection of various user module and resources and command sequences. The input interface 165 may be a USB port, a serial port, Ethernet port, or any other interface port configured to transmit electronic data to the system 100.

The video processor 160 provides graphical output from the system 100. The video processor 160 is configured to display color coded user modules and corresponding resources.

The decoupling module 110 determines which resource blocks can be decoupled and which resource blocks require coupling for an associated user module. In one embodiment, two or more resources may be coupled together and be required to implement a user module. The resources coupled together can be positioned and iterated through multiple placement positions as a single block. A physical requirement that two block be located in close proximity to each other is one reason for coupling multiple blocks together. In another embodiment, every resource is decoupled and allowed to iterate through multiple placement positions independently. The resource utilization detector 110 also links the user module with the corresponding associated resources.

In one embodiment, the analog programmable resources are decoupled from the digital programmable resources. In another embodiment, analog resources are decoupled from other analog devices. In yet another embodiment, digital resources are decoupled from other digital resources.

The resource placement locator 120 locates available resources that would be suitable for realizing an unplaced module. The module, or user module, is a circuit design. In one embodiment, the resource placement locator 120 is configured to accept the requirements for the unplaced module and to search for a resource from the available resources that would satisfy these requirements.

In another embodiment, the resource placement locator 120 sequentially searches for possible resource configurations from the available resources. For example, the resource placement locator 120 can be configured to find a first set of resources which fulfill the requirements for the unplaced module. Next, the resource placement locator 120 can be configured to sequentially find a second set of resources that are different from the first set of resources which also fulfill the requirements for the unplaced module.

The color coordinator 180 graphically matches the module and the associated corresponding resources that have been selected or designated to realize the user module. In one embodiment, the color coordinator 180 color codes the module and the associated corresponding resources. In one embodiment, the color coordinator 180 is configured to select a unique color to display both an unplaced module and a possible set of available resources corresponding to the requirements of the unplaced module. In another embodiment, the color coordinator 180 is configured to select a unique color to display an unplaced module and another unique color to display a fixed resource and another unique color to display a next placement resource.

In one embodiment, matching colors can be utilized. In another embodiment, matching grayscales also can be utilized. In yet another embodiment, matching patterns can also be utilized.

Figure 2A:
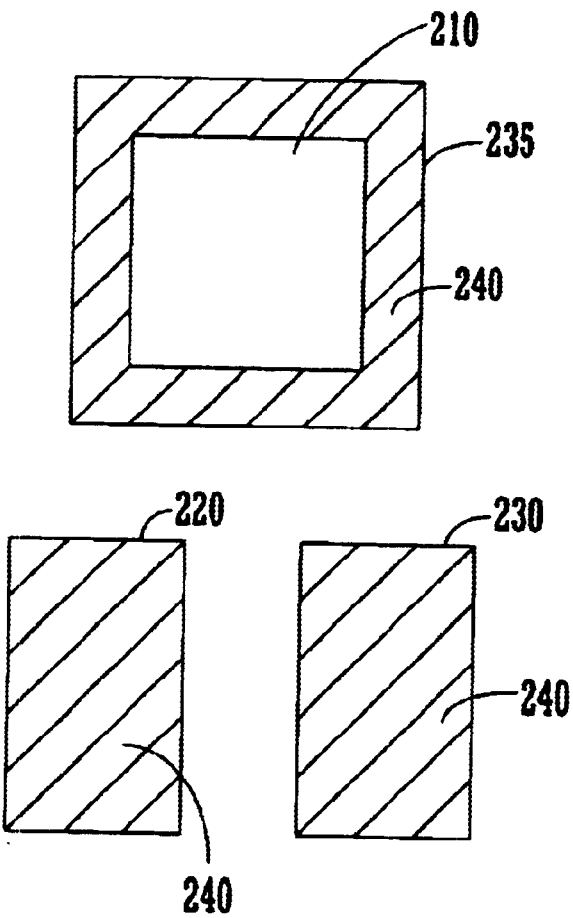
FIGS. 2A, 2B, and 2C illustrate various embodiments for color coding modules and associated resources in accordance with the invention.
Figure 2B:
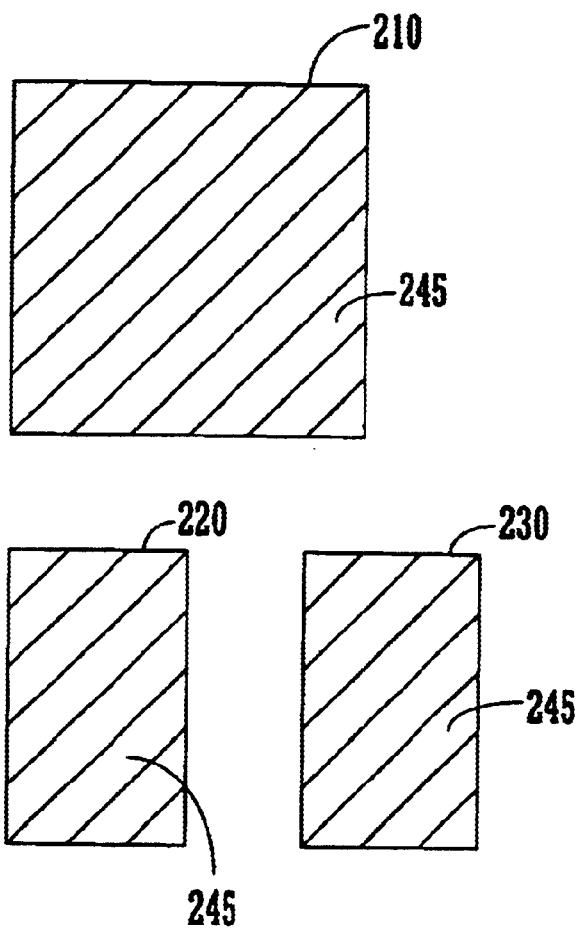
Figure 2C:
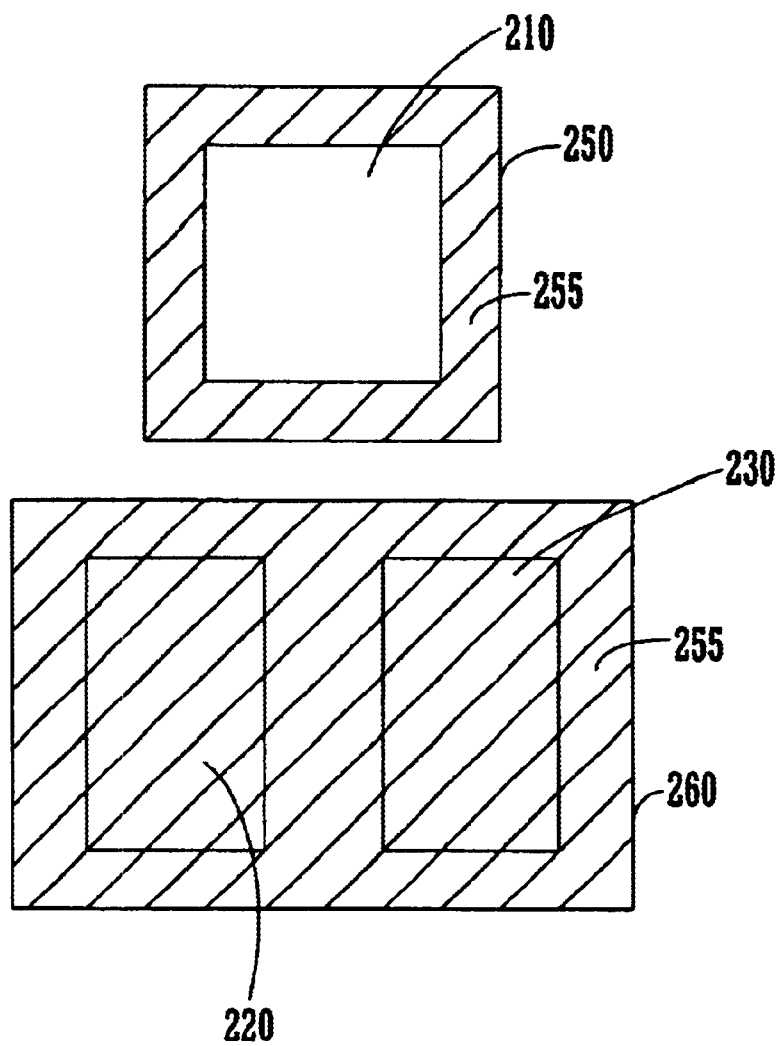

FIGS. 2A, 2B, and 2C each illustrate one embodiment of the color coordinator 180 displaying a unique color that corresponds with a module and resources which correspond with the module. For the sake of clarity, common element numbers are utilized to represent similar items to avoid unnecessary confusion. For example, a module 210 and the corresponding resources 220 and 230 are utilized in FIGS. 2A, 2B, and 2C to merely illustrate the different embodiments of color coding the module 210 with the corresponding resources 220 and 230. Additional modules and resources can be displayed simultaneously.

In FIG. 2A, a ring 235 appears around an icon representation of the module 210. In one embodiment, the ring 235 is displayed filled in with a cross-hatched pattern 240 to represent a unique color. However, in other embodiments, different shading techniques may be utilized. The resources 220 and 230 are also filled in with the cross-hatched pattern 240. The same cross-hatched pattern 240 within the ring 235 and within the corresponding resources 220 and 230 visually indicate that the module 210 corresponds to the resources 220 and 230.

In FIG. 2B, the module icon 210 is displayed filled in with a cross-hatched pattern 245 to represent a unique color. However, in other embodiments, different shading techniques may be utilized. The resources 220 and 230 are also filled in with the cross-hatched pattern 245. The same cross-hatched pattern 245 within the module 210 and within the corresponding resources 220 and 230 visually indicate that the module 210 corresponds to the resources 220 and 230.

In FIG. 2C, a ring 250 appears around the module icon 210. In one embodiment, the ring 250 is displayed filled in with a cross-hatched pattern 255 to represent a unique color. However, in other embodiments, different shading techniques may be utilized. An area 260 is also filled in with the cross-hatched pattern 255. The area 260 includes the resources 220 and 230. The same cross-hatched pattern 255 within the ring 250 and within the area 260 visually indicate that the module 210 corresponds to the resources 220 and 230.

Figure 3:
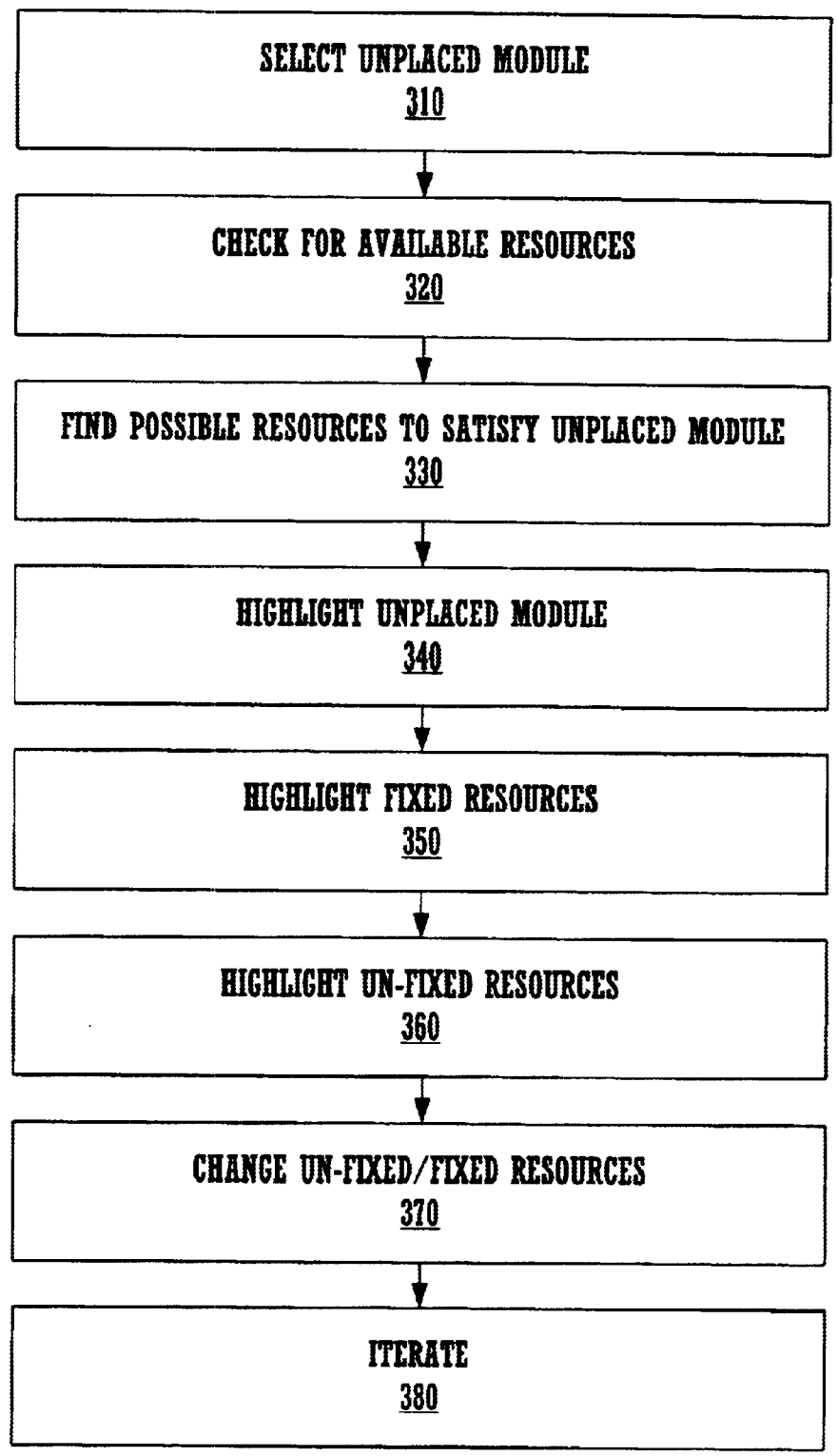
FIG. 3 illustrates a process flow diagram of one embodiment of the invention.

FIGS. 3 illustrates a process flow diagram in accordance with an embodiment of the invention. The functional blocks are not to be construed as limiting the number of functional blocks within the process flow diagrams nor to be construed as a requirement for every functional block. The blocks may be performed in a different sequence without departing from the spirit of the invention. Further, blocks may be deleted, added or combined without departing from the spirit of the invention.

FIG. 3 illustrates one embodiment showing the selection of an unplaced module and-the viable options of possible resources which meet the requirement of the unplaced module. In Block 310, an unplaced module is selected. In Block 320, a check is performed for all available resources on the chip. Available resources can be defined as resources within the chip that are not currently utilized by another-module. In another embodiment, vacant and occupied resources are considered together as possible locations for the selected user module.

In Block 330, a check occurs to find possible resources which satisfy the requirements of the module. In one embodiment, the function within the Block 330 can be performed by the resource placement locator 120 (FIG. 1).

In Block 340, the selected unplaced module is highlighted. The goal of highlighting is to visually distinguish the selected unplaced module from other modules.

In Block 350, the fixed resources are highlighted. In Block 360, the unfixed resources are highlighted. The fixed and unfixed resources together satisfy the requirements of the selected unplaced module. The fixed resources represent hardware resources which are held static and are not iterated. In other words, the fixed resources do not change with a subsequent iteration of possible placement options. The unfixed resources represent hardware resources which are changed with subsequent iterations. Each iteration illustrates a possible hardware resource allocation for the unfixed resources.

In one embodiment, the fixed resource and the unfixed resources are determined by the decoupling module 110 (FIG. 1). In one embodiment, the fixed resources are highlighted in a unique color relative to the unfixed resources. The first set of resources are unique to the second set of resources.

Various embodiments of highlighting are shown in FIGS. 2A, 2B, and 2C. In one embodiment, the function within the Blocks 340, 350 and 360 can be performed by the color coordinator 180 (FIG. 1).

In Block 370, there is an opportunity to change the distribution of the fixed and unfixed resources as highlighted in the Block 360. If a change is requested, selection of the unfixed resources can be accepted, and different modules can be appropriately highlighted in the Blocks 350 and 360. In one embodiment, the fixed module is changed into the unfixed module by graphically selecting the fixed module through the input interface 130 (FIG. 1).

In Block 380, the unfixed resources are iterated. The unfixed resources are moved into the next available hardware resource which satisfies the requirements associated with the unfixed resources. Multiple iterations can be performed. The unfixed resources keep moving with each iteration into the next available hardware resource which satisfies the requirement associated with the unfixed resources. In one embodiment, when the unfixed resources have been iterated through a full cycle of possible hardware resource placements, the unfixed resources become fixed resources, and one of the fixed resources becomes unfixed. In another embodiment, the unfixed resources remain until a change is selected as illustrated in the Block 370.

Figure 4:
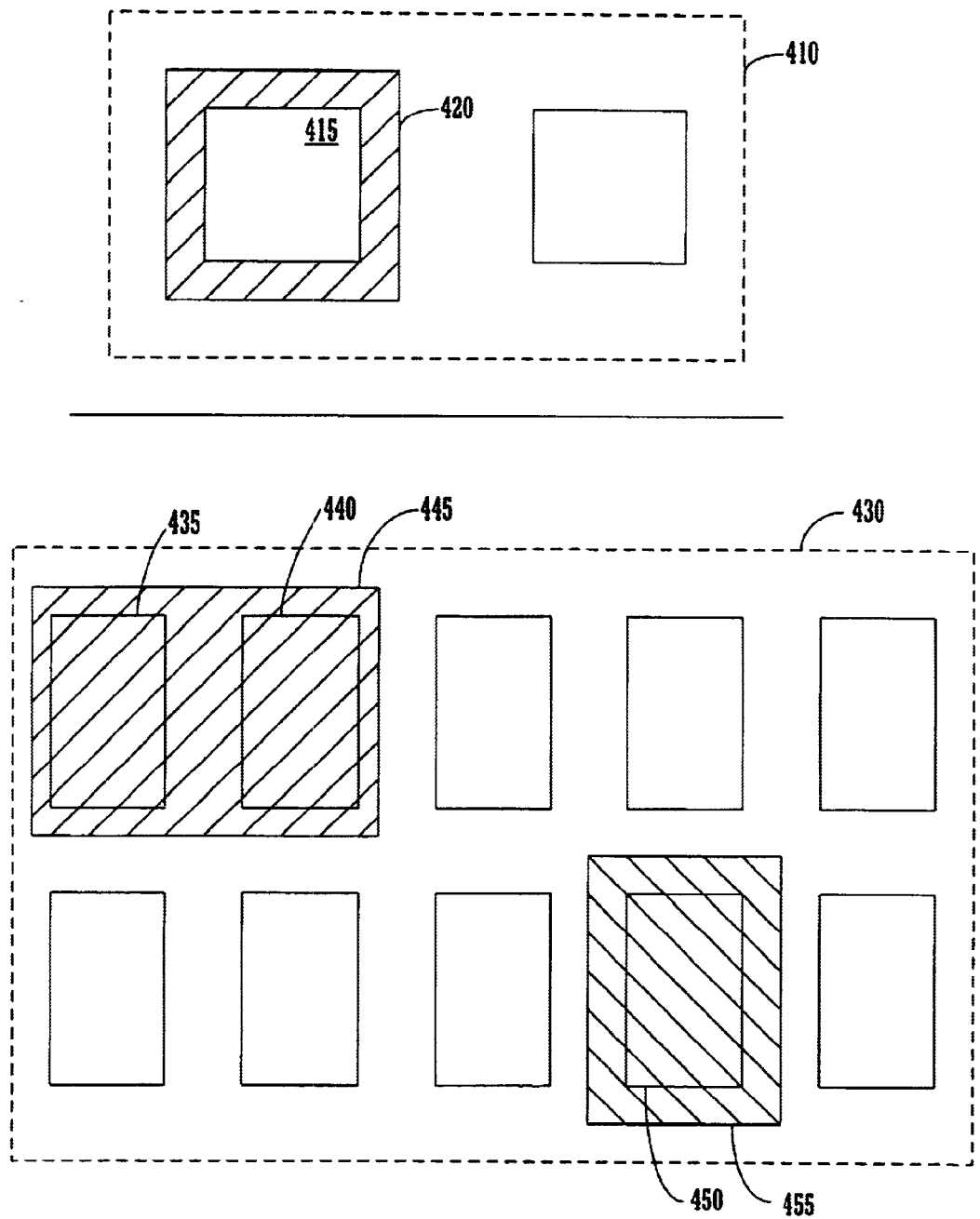
FIG. 4 illustrates a display screen from one embodiment of the invention.

FIG. 4 illustrates one embodiment of a display screen showing a group of modules and a group of resources. For example, a module grouping 410 and a resource grouping 430 are utilized in FIG. 4 to merely illustrate a graphical representation of the general layout of the plurality of modules and resources. Additional modules and resources can be displayed simultaneously.

In one embodiment, FIG. 4 illustrates a highlighted module 415 within the module grouping 410. The highlighted module 415 is shown with a ring 420 surrounding the module 415. The ring 420 is shown with a first cross-hatched pattern. The highlighted module 415 graphically illustrates that this particular module is selected from the module grouping 410.

Resources 435, 440, and 450 are shown highlighted and correspond to the module 415. The resources 435, 440, and 450 are shown within the resource grouping 430. The resources 435 and 440 are also shown highlighted with a second cross-hatched pattern 445. The resource 450 is shown highlighted with a third cross-hatched pattern 455.

In one embodiment, the resources 435 and 440 are decoupled from the resource 450 as illustrated by the second cross-hatched pattern 445 and the third cross-hatched pattern 455, respectively. In one embodiment, the resources 435 and 440 are coupled together and placed as a group.

In one embodiment, the second cross-hatched pattern 445 graphically represent the area covered by the unfixed resources, and the third cross-hatched pattern 455 graphically represents the area covered by the fixed resources. Accordingly, in this embodiment, the resources 435 and 440 are initially unfixed, and the resource 450 is initially fixed. However, the resources 435 and 440 can become fixed resources at any time by finalizing placement of the resources 435, 440, and 450 of the module 415 or by selecting the resource 450 as the unfixed resource.

In operation, as a next placement is requested, the resources 435 and 440 are iterated to a next available position for placement. The second cross-hatched pattern 445 follows the resources 435 and 440 to their next location. If a next placement is requested again, the resources 435 and 440 would be iterated again to the next available position as long as the resources 435 and 440 are unfixed. At any time during this process, the resources 435 and 440 can have their placements finalized by either finalizing placement for the resources 435, 440, and 450 or by selecting the resource 450 as the unfixed resource.

In another embodiment, there can be more or fewer resources associated with the second and third cross-hatched patterns 445 and 455. There can also be more than one group of fixed resources. The second and third cross-hatched patterns 445 and 455 and their associated resources are shown for exemplary purposes.

NEXT PLACEMENT ITERATOR EXAMPLE

Figure 5A:
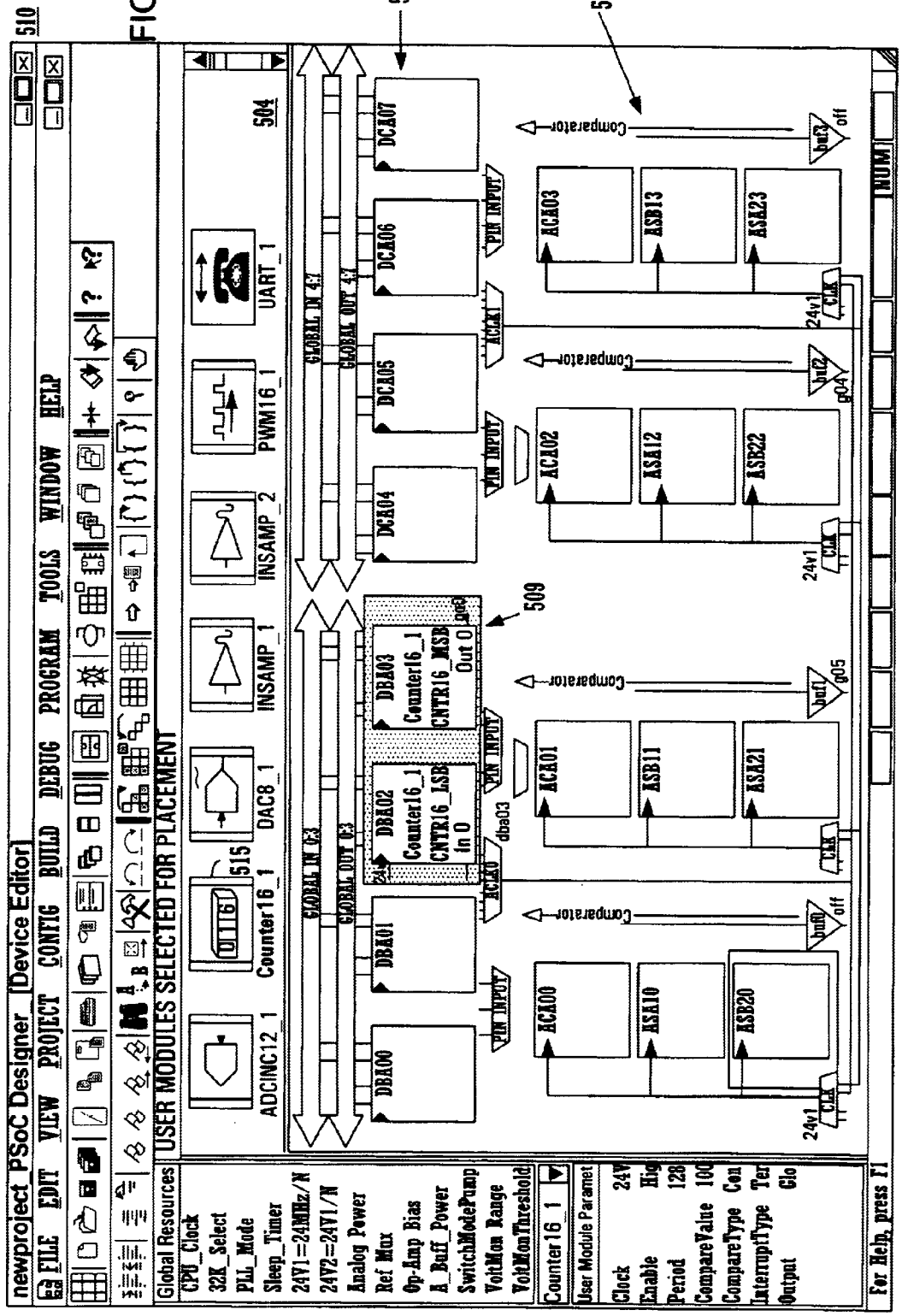
FIG. 5A illustrates an exemplary screen diagram of a next placement iteration procedure of an embodiment of the present invention where one user module is placed.

FIG. 5A illustrates an example computer screen diagram 510 of a next placement iterator process in accordance with one embodiment of the present invention. In accordance with the graphical user interface, the digital resources (here, eight) are shown in an upper horizontal row 505 and the analog resources (here, twelve) are shown in a lower situated matrix 507. A selection bar 505 comprises user module icons that can be selected. The user module icon 515 ("counter") is currently selected. The allocated resources 509 that are designated to implement user module 515 are also highlighted. In this embodiment, the color ring that surrounds user module icon 515 is color coded to the allocated resources 509. Therefore, this user module 515 is currently placed. The remaining user module icons of the selection bar 504 remain unplaced.

Figure 5B:
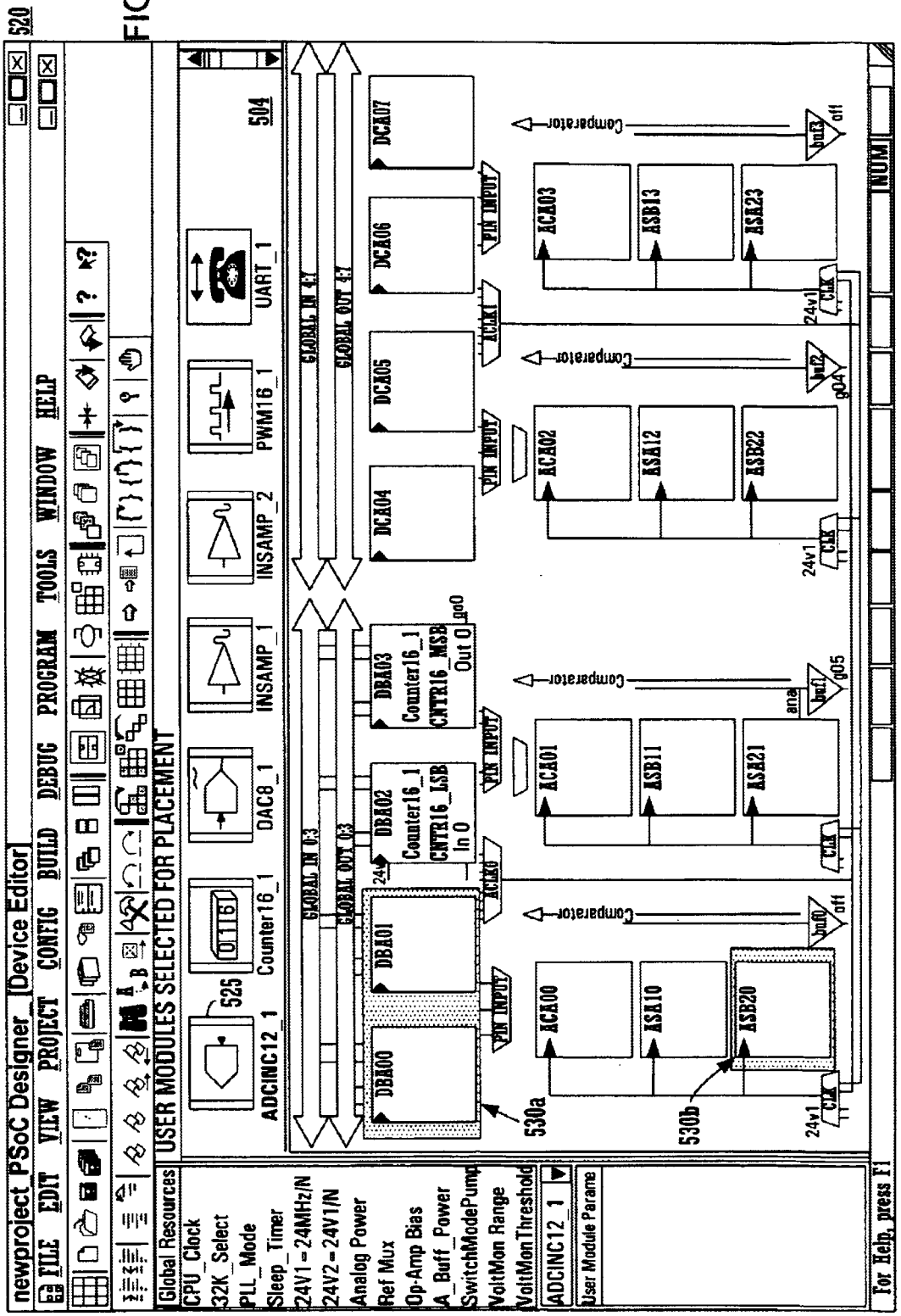
FIG. 5B illustrates an exemplary screen diagram of a next placement iteration procedure of an embodiment of the present invention where a subject user module is selected and showing an initial possible placement designation for the subject user module.

FIG. 5B illustrates an example computer screen diagram 520 of the next placement iterator process in accordance with one embodiment of the present invention where the user selects an unplaced user module icon 525 (the "ADCINC"). Since the module 525 is unplaced, it does not have an associated color ring. Upon selection of the user module icon 525, an initial possible placement for this design is displayed. The initial possible placement includes two digital resources (blocks) 530a and one analog resource 530b. In the embodiment shown, only vacant blocks were selected as the initial placement, however, in another embodiment, the computer could also designate a used block as a potential placement option for user module 525. Of course, a block would have to be made vacant before it could be used for user module 525.

Figure 5C:
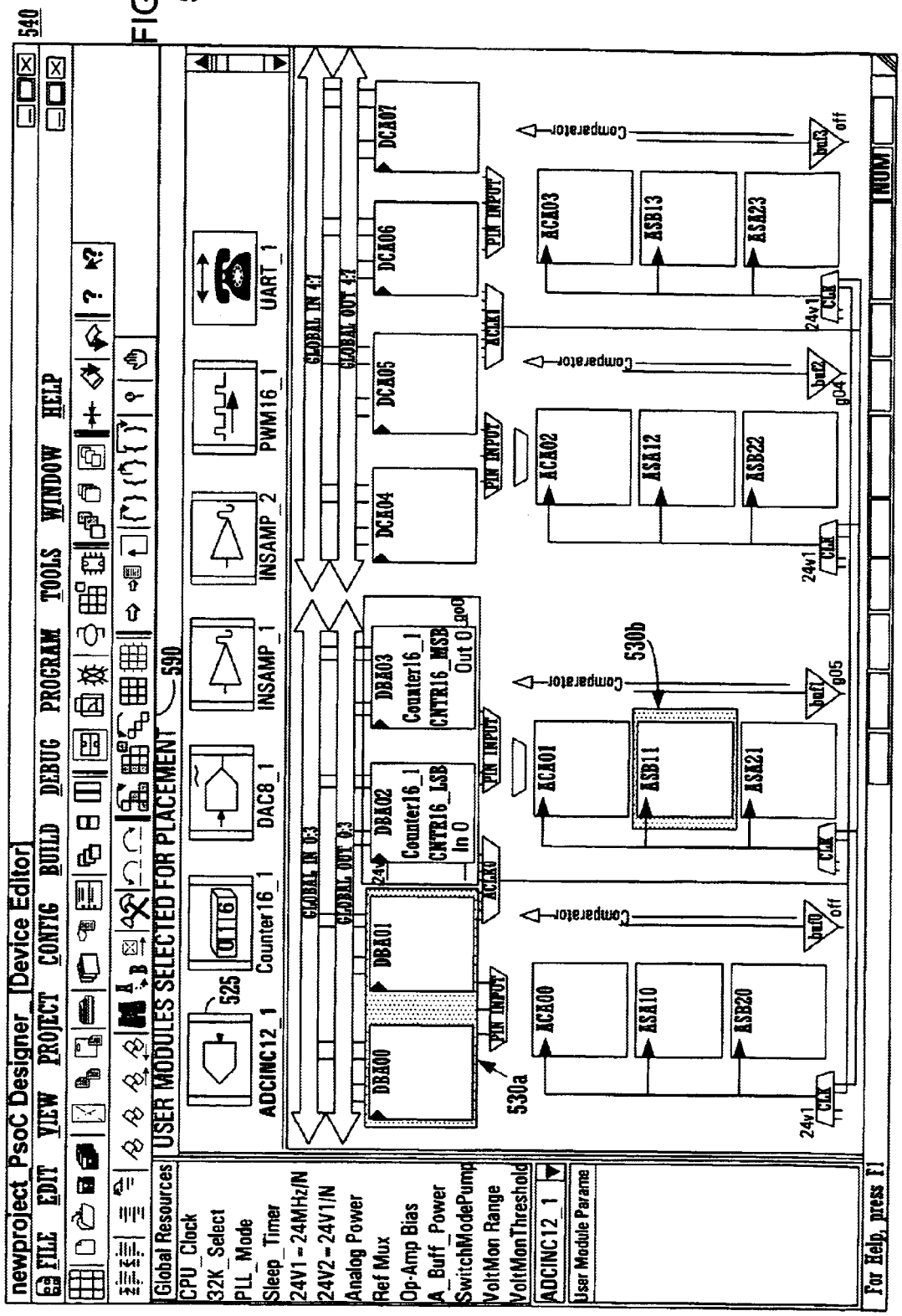
FIG. 5C illustrates an exemplary screen diagram of a next placement iteration procedure of an embodiment of the present invention where a subject user module is selected and the digital portion of the initial placement is maintained while the analog portion is iterated to a next placement (second).

FIG. 5C illustrates an example computer screen diagram 530 of the next placement iterator process in accordance with one embodiment of the present invention where the user invokes a next placement iteration for module icon 525 (the "ADCINC"). In particular, the user uses the cursor control device to select resource 530b. This causes the cross hatching behind the analog resource 530b to change colors from the cross hatching behind the digital resources 520a. Once selected, the user clicks the "next placement" icon 590, this causes the analog resource to move from its initial location in FIG. 5B to its new location in FIG. 5C. FIG. 5C therefore illustrates a second possible placement for the selected user module 525. By selecting the analog resource 530b before pressing the next placement icon 590, the user decoupled the placement of the digital versus analog resources. In other words, the digital resources 530a remained fixed from FIG. 5B to FIG. 5C.

Figure 5D:
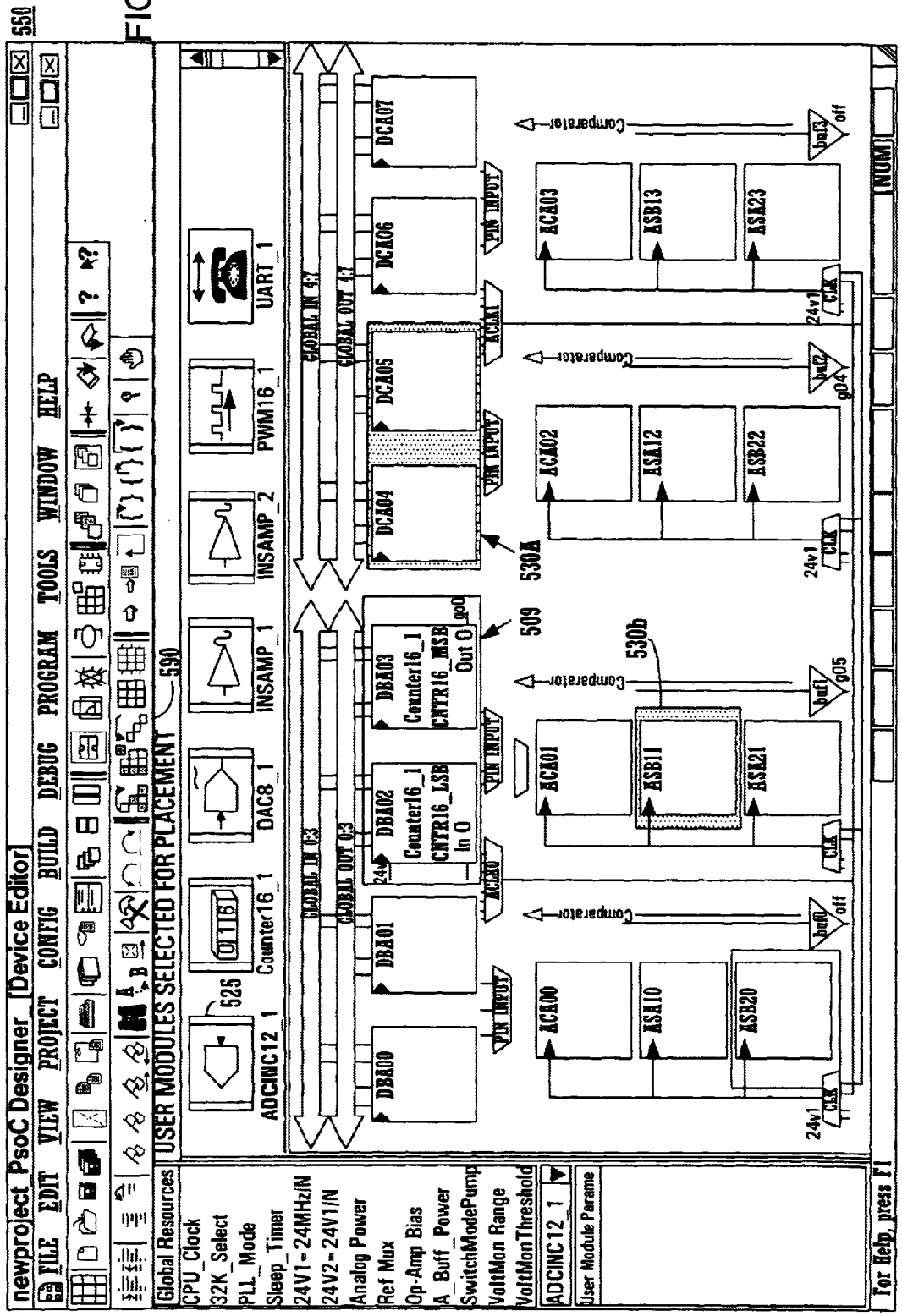
FIG. 5D illustrates an exemplary screen diagram of a next placement iteration procedure of an embodiment of the present invention where a subject user module is selected and the analog portion of the second placement is maintained while the digital portion is iterated to a next placement (third).

FIG. 5D illustrates an example computer screen diagram 540 of the next placement iterator process in accordance with one embodiment of the present invention where the user invokes a next placement iteration for module icon 525 (the "ADCINC"). In particular, the user uses the cursor control device to select digital resource 530a. This causes the cross hatching behind the digital resources 530a to change colors from the cross hatching behind the analog resource 520b. Once selected, the user clicks the "next placement" icon 590, this causes the digital resource 530a to move from its initial location in FIG. 5B to position 509 (an occupied position). The user clicks the icon 590 again thereby causing the digital resource 530a to appear in its position as shown in FIG. 5D. FIG. 5D therefore illustrates a third possible placement for the selected user module 525. By selecting the digital resource 530a before pressing the next placement icon 590, the user decoupled the placement of the digital versus analog resources. In other words, the analog resource 530b remained fixed from FIG. 5C to FIG. 5D.

Figure 5E:
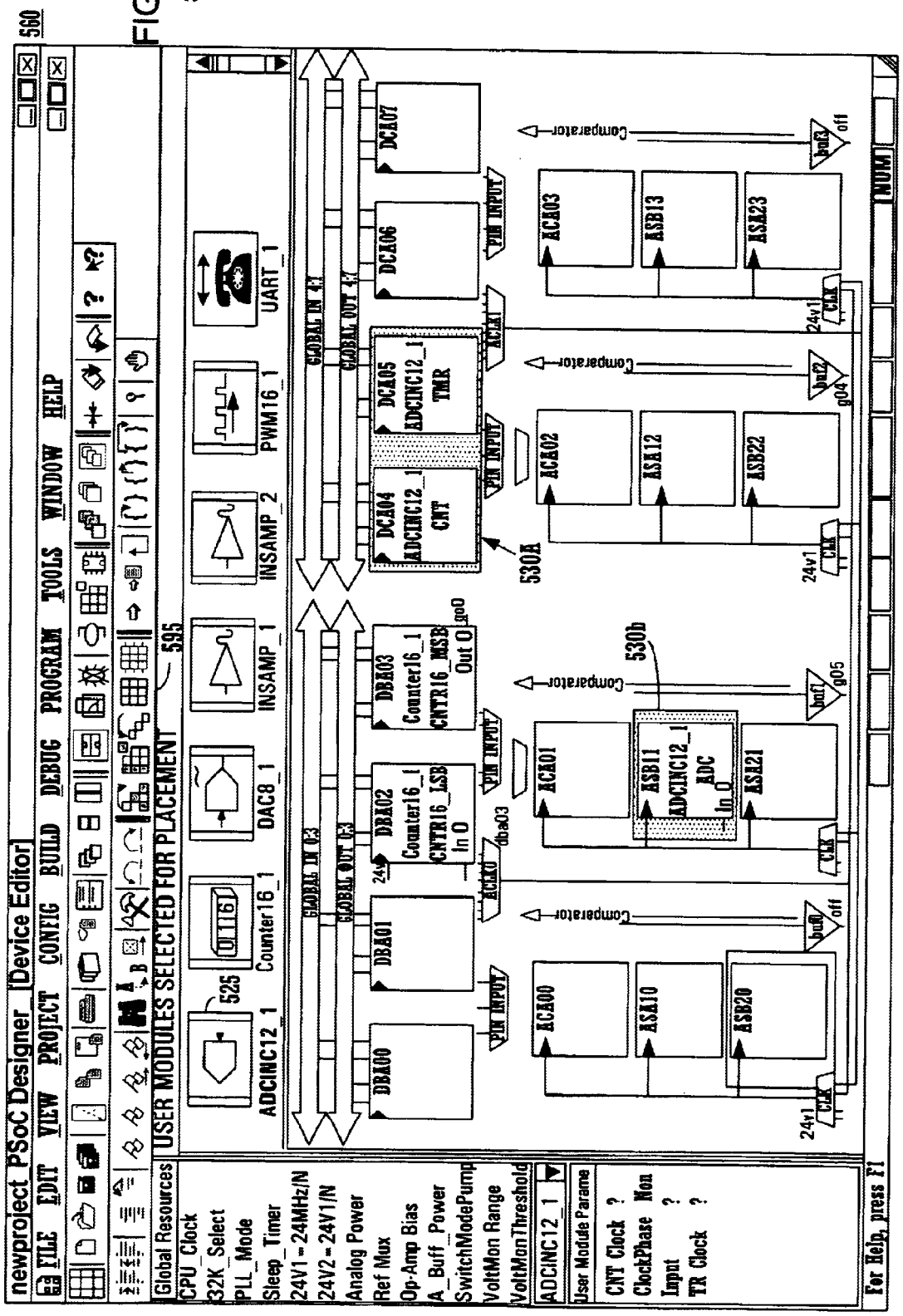
FIG. 5E illustrates an exemplary screen diagram of a next placement iteration procedure of an embodiment of the present invention where a subject user module is placed using the third placement of FIG. 5D.

FIG. 5E illustrates an example computer screen diagram 560 of the next placement iterator process in accordance with one embodiment of the present invention where the user then places the user module 525. In accordance with the graphical user interface, the user then selects the "place user module" icon 595 and the user module 525 becomes placed using the last possible placement. In accordance with placing, a color ring appears around the module icon 525. Further, the hardware resources 530 appear in a matching color and they now have labels ("ADCINC . . . ") that correspond to the placed icon 525.

By decoupling the digital from the analog resources during the next placement iteration process, the present invention reduces the number of possible placements that have to be cycled through by the user before the desired placement is found.

The foregoing descriptions of specific embodiments of the invention have been presented for purposes of illustration and description. They are not intended to be exhaustive or to limit the invention to the precise embodiments disclosed, and naturally many modifications and variations are possible in light of the above teaching. The embodiments were chosen and described in order to explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of designing an integrated circuit comprising:
   a. initializing a user module wherein the user module requires a first hardware resource and a second hardware resource;
   b. identifying a first possible placement location on an array of programmable hardware of the integrated circuit for the first hardware resource;
   c. identifying a second possible placement location on the array for the second hardware resource;
   d. fixing the first hardware resource to the first possible placement location; and
   e. iterating the second hardware resource to a third possible placement location on the array as a possible placement location.

2. The method according to claim 1 further comprising unfixing the first hardware resource.

3. The method according to claim 1 further comprising requesting a next placement of the second hardware resource.

4. The method according to claim 1 wherein initializing the user module includes selecting the user module.

5. The method according to claim 1 wherein initializing the user module further comprises placing the user module on the integrated circuit.

6. The method according to claim 1 wherein the first hardware resource is a digital programmable block.

7. The method according to claim 1 wherein the first hardware resource is an analog programmable block.

8. The method according to claim 7 wherein the second hardware resource is a digital programmable block.

9. The method according to claim 6 wherein the second hardware resource is an analog programmable block.

10. The method according to claim 1 wherein identifying the first possible placement location and the second possible placement location occur simultaneously.

11. The method according to claim 1 further comprising highlighting the first possible placement location to correspond with the user module.

12. The method according to claim 1 further comprising highlighting the second possible placement location to correspond with the user module.

13. The method according to claim 1 further comprising highlighting the third possible placement location to correspond with the user module.

14. The method according to claim 1 further comprising highlighting the first hardware resource to correspond with a fixed resource.

15. The method according to claim 1 further comprising highlighting the second hardware resource to correspond with an unfixed resource.

16. A method of designing an integrated circuit comprising:
   a. initializing a user module wherein the user module includes a hardware resource;
   b. identifying a first possible placement location on an array of programmable hardware of the integrated circuit for the hardware resource;
   c. receiving a request for a next placement for the hardware resource; and
   d. identifying a second possible placement location on the array for the hardware resource in response to receiving the request.

17. The method according to claim 16 wherein identifying the first possible placement location and the second possible placement location are performed sequentially.

18. The method according to claim 16 further comprising graphically displaying the first possible placement location.

19. The method according to claim 16 further comprising graphically displaying the first possible placement location in a color corresponding to the user module.

20. The method according to claim 19 wherein the color surrounds the first possible placement location.

21. The method according to claim 16 further comprising graphically displaying the second possible placement location.

22. The method according to claim 16 further comprising graphically displaying the second possible placement location in a color corresponding to the user module.

23. The method according to claim 22 wherein the color surrounds the second possible placement location.

24. A system for designing an integrated circuit comprising:
   a. a decoupling module configured to separate a plurality of resources which correspond to a user module into a fixed resource and an unfixed resource;
   b. a resource placement locator connected to the decoupling module and configured to find a next possible placement location on an array of programmable hardware resources of the integrated circuit for the unfixed resource; and
   c. a color coordinator connected to the resource placement locator configured to uniquely highlight the unfixed resource and the fixed resource.

25. The system according to claim 24 further comprising an input interface connected to the decoupling module configured to select the unfixed resource.

26. In a computer system, a method of designing an integrated circuit comprising:
   a) displaying a plurality of images each representing a programmable resource, said plurality of images comprising a first set and a second set and representing an array of programmable hardware resources of the integrated circuit;
   b) displaying a first placement of a user module, said first placement comprising a first resource of said first set visually distinguished and a second resource of said second set visually distinguished; and
   c) responsive to a user request, displaying a second placement of said user module, said second placement comprising said first resource of said first set visually distinguished and a third resource of said second set visually distinguished, wherein said second and third resources are different.

27. A method as described in claim 26 wherein said first set comprises digital programmable blocks and said second set comprises analog programmable blocks.

28. A method as described in claim 26 wherein said first set comprises analog programmable blocks and said second set comprises digital programmable blocks.

29. A method as described in claim 26 further comprising said user selecting said second resource of said second set before the display of said second placement.

30. A method as described in claim 26 further comprising, responsive to a user request, displaying a third placement of said user module, said third placement comprising a fourth resource of said first set visually distinguished and said third resource of said second set visually distinguished, wherein said first and fourth resources are different.

31. A method as described in claim 30 further comprising placing said user module using said third placement.

32. A method as described in claim 30 further comprising said user selecting said first resource of said first set before the display of said third placement.

33. A method as described in claim 26 further comprising placing said user module using said second placement.

34. A computer system comprising a processor coupled to a bus and a memory coupled to said bus and containing instructions for implementing a method of designing an integrated circuit comprising:
   a) displaying a plurality of images each representing a programmable resource, said plurality of images comprising a first set and a second set and representing an array of programmable hardware resources of the integrated circuit;
   b) determining and displaying a first placement of a user module, said first placement comprising a first resource of said first set visually distinguished and a second resource of said second set visually distinguished; and
   c) responsive to a user request, determining and displaying a second placement of said user module, said second placement comprising said first resource of said first set visually distinguished and a third resource of said second set visually distinguished, wherein said second and third resources are different.

35. A computer system as described in claim 34 wherein said first set comprises digital programmable blocks and said second set comprises analog programmable blocks.

36. A computer system as described in claim 34 wherein said first set comprises analog programmable blocks and said second set comprises digital programmable blocks.

37. A computer system as described in claim 34 wherein said method further comprises said user selecting said second resource of said second set before the display of said second placement.

38. A computer system as described in claim 34 wherein said method further comprises, responsive to a user request, displaying a third placement of said user module, said third placement comprising a fourth resource of said first set visually distinguished and said third resource of said second set visually distinguished, wherein said first and fourth resources are different.

39. A computer system as described in claim 38 wherein said method further comprises placing said user module using said third placement.

40. A computer system as described in claim 38 wherein said method further comprises said user selecting said first resource of said first set before the display of said third placement.

41. A computer system as described in claim 34 wherein said method further comprises placing said user module using said second placement.

* * * * *